United States Patent
Thatcher et al.

(10) Patent No.: US 6,795,788 B2
(45) Date of Patent: Sep. 21, 2004

(54) METHOD AND APPARATUS FOR DISCOVERY OF OPERATIONAL BOUNDARIES FOR SHMOO TESTS

(75) Inventors: Paul A. Thatcher, Provo, UT (US); Gopikrishna Jandhyala, Sunnyvale, CA (US)

(73) Assignee: Hewlett-Packard Development Company, L.P., Houston, TX (US)

(*) Notice: Subject to any disclaimer, the term of this patent is extended or adjusted under 35 U.S.C. 154(b) by 136 days.

(21) Appl. No.: 10/028,039

(22) Filed: Dec. 20, 2001

(65) Prior Publication Data

US 2003/0120451 A1 Jun. 26, 2003

(30) Foreign Application Priority Data

Jun. 6, 2000 (DE) .......................................... 100 28 039

(51) Int. Cl.[7] .............................................. G06F 19/00
(52) U.S. Cl. ......................... 702/119; 702/58; 702/108; 702/119; 702/183; 438/5; 438/14; 438/17; 324/439; 324/601; 324/612; 324/765; 714/709; 714/718; 714/724
(58) Field of Search .......................... 702/58, 59, 108, 702/117–119, 124, 126, 183, 185, 189, FOR 103, 104, 134, 170, 171; 714/709, 718, 712, 724, 738, 740, 745, 744, 799, FOR 288; 438/5, 14, 17; 324/439, 612, 438, 601, 765; 337/82, 94, 323, 360, 392

(56) References Cited

U.S. PATENT DOCUMENTS 6,079,038 A * 6/2000 Huston et al. .............. 714/724
6,418,387 B1 * 7/2002 Carney ........................ 702/81

OTHER PUBLICATIONS

Niggemeyer et al., Parameteric Built–In–Self–Test of VLSI Systems, Jan. 1999, University of Hannover, pp. 1–5.*
Hamada et al., A High–speed Boundary Search by Shmoo Plot for ULSI Memories, Jan. 1993, IEEE, vol: 4150, pp. 4–9.*

* cited by examiner

Primary Examiner—Marc S. Hoff
Assistant Examiner—Elias Desta (57) ABSTRACT

Method and apparatus for discovery of operational boundaries for shmoo tests. Specifically, a method of testing operational boundaries is described in one embodiment of the present invention. The method discloses the discovery of an operational range for a hardware device over a plurality of varying operating parameters. The operational range is discovered by testing points, as defined by the plurality of varying operating parameters, to discover an operational boundary of the device. The operational boundary comprises a plurality of boundary points that lie just outside of the operational range of the device. The operational boundary is discovered automatically and without testing all of a plurality of interior operational points within the operational boundary.

30 Claims, 4 Drawing Sheets

100

110

| F | F | F | F | F | . | . | . | . | . | . | 3.3 |
| F | F | F | F | F | . | . | . | . | . | . | 3.3165 |
| F | F | F | F | F | . | . | . | . | . | . | 3.333 |
| F | F | F | F | F | . | . | . | . | . | . | 3.3495 |
| F | F | F | F | F | F | F | . | . | . | . | 3.366 |
| F | F | F | F | F | F | F | . | . | . | . | 3.3825 |
| F | F | F | F | F | F | F | . | . | . | . | 3.399 |
| F | F | F | F | F | F | F | F | . | . | . | 3.4155 |
| F | F | F | F | F | F | F | F | . | . | . | 3.432 |
| F | F | F | F | F | F | F | F | F | . | . | 3.4485 |
| F | F | F | F | F | F | F | F | F | . | . | 3.465 |

FIRST OPERATING PARAMETER 1 1 1 1 1 1 1 1 1 1 1
7 7 7 7 7 7 7 7 7 7 8
1 1 2 3 4 5 6 7 8 9
  9 8 7 6 5 4 3 2 1

SECOND OPERATING PARAMETER

```
StartPoint=( 1.95000, 3.50000))
HorizontalStepSize= 0.05000          VerticalStepSize= 0.05000
HorizontalRange    1.00000 - 2.60000 VerticalRange  -2.00000 - 4.60000
```

250 (with arrow)

Second Operating Parameter 220

230

235

First Operating Parameter 210

```
Points Tested = 130
```

METHOD AND APPARATUS FOR DISCOVERY OF OPERATIONAL BOUNDARIES FOR SHMOO TESTS

FIELD OF INVENTION

The present invention relates generally to the field of hardware testing and pertains more particularly to a method of and apparatus for discovering the operational range of an electronic device.

BACKGROUND OF THE INVENTION

Testing of electrical components, such as microprocessors, and other hardware components ensures proper operation of the particular components. In addition, testing of the hardware components helps define the operational specifications, as defined by a plurality of operating parameters, over which the hardware component is operational.

Various operating parameters are varied to test for and discover the electrical operating ranges of the hardware component. A specific set of conditions as defined by the various operating parameters is referred to as a point.

Previously, automatic testing of the hardware device to discover the electrical operating ranges of a hardware component entailed testing of all the points within a predefined testing region. This process is undesirable for various reasons, all of which increase the amount of time needed for testing.

Figure 1:
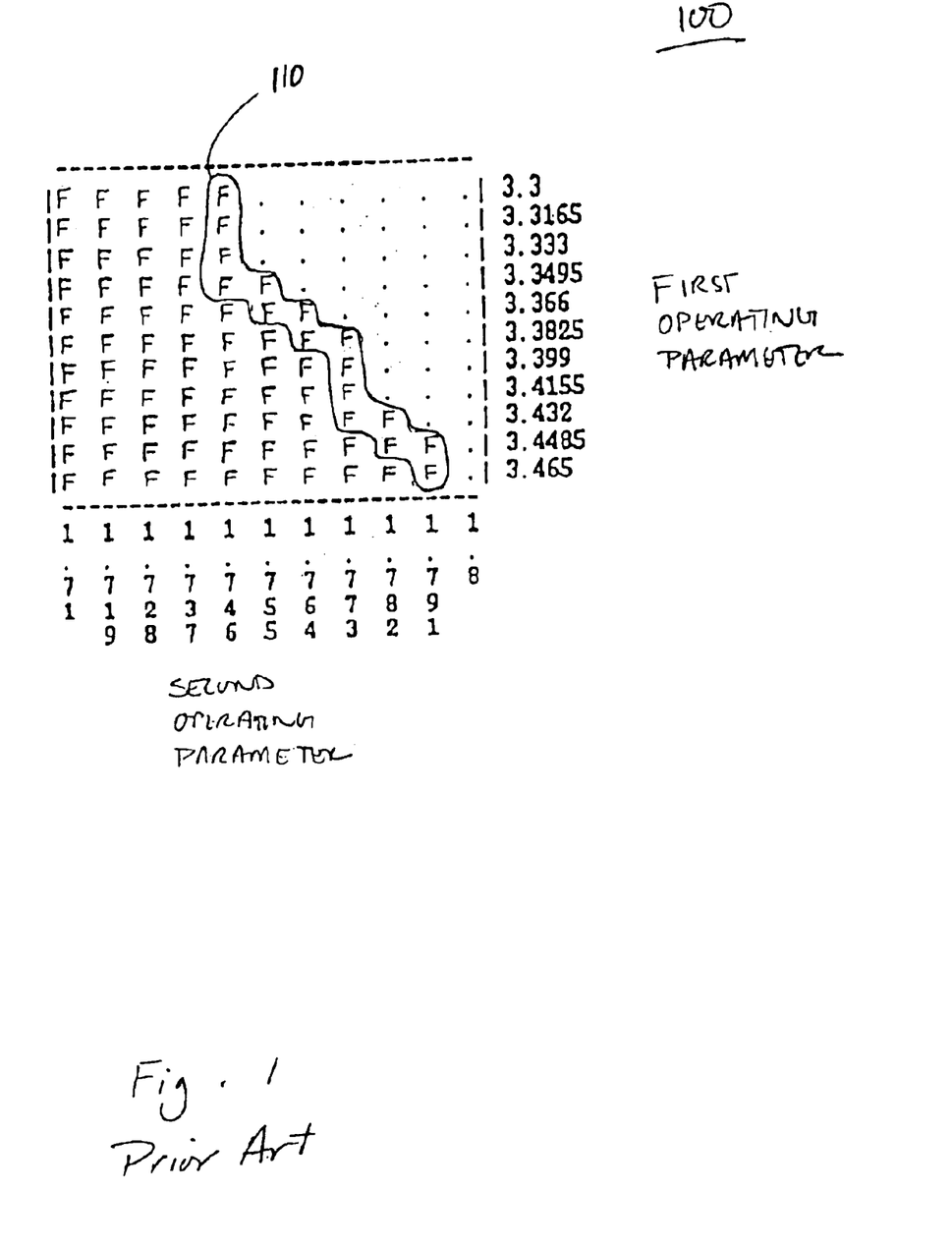
FIG. 1 is a plot diagram of a testing region showing tested points of failure and operation.

Prior art FIG. 1 is a plot diagram 100 illustrating tested points within a predefined testing region. In the diagram 100, two operating parameters are varied. Points designated by the letter "F" indicate a failure by the hardware component. Points designated by a "dot" indicate an successful operation by the hardware component. The testing region is defined by a first operating parameter on the horizontal axis, and a second operating parameter on the vertical axis, and includes all the points in diagram 100. The first operating parameter varies with values ranging from 3.3 to 3.465. The second operating parameter varies with values ranging from 1.71 to 1.80. These parameters can include input/output voltages, clock frequencies, and temperature, etc.

In the past, testing of all the points in a predefined testing region often times would not provide any additional useful information. For example, once an operational boundary is found, further points within the operational boundary need not be tested, and further points outside the operational boundary need not be tested. Although further testing of points inside or outside of the operational boundary was unnecessary, these points were still tested.

For example, looking at diagram 100, the point with parameter coordinates of 1.8 and 3.3 is clearly within the operational range of the hardware component and need not be tested. Similarly, the point with parameter coordinates of 1.71 and 3.465 is clearly outside of the operational range of the hardware component and also need not be tested. No further information is gained from testing these two points.

Testing of points within a testing region adds and wastes a significant amount of time for each point tested unnecessarily. Referring back to Prior Art FIG. 1, once the operational boundary is fully determined within the testing region, no other points need be tested. For example, once adjacent failure points that are also adjacent to operational points are discovered within the region, testing of the remaining points provides limited or no further information. Points within region 110 define the operational boundary for the hardware component tested in diagram 100. For example, failure points outside of region 110 are unnecessarily tested.

Furthermore, the predefined testing region provides a limitation to the discovery of the operational specifications of the hardware component. The testing region is defined manually as a best guess estimate. Should the testing region be too small, the region may not include all of the operational boundary for the hardware device. In that case, the testing region needs further manual expansion and retesting of the expanded region. On the other hand, if the testing region is too large, the region will include too many unnecessary points for testing, thereby wasting testing time, energy, and resources.

SUMMARY OF THE INVENTION

Embodiments of the present invention describe a method and apparatus for conducting a boundary search for shmoo tests on an electronic device. Specifically, a method of testing operational boundaries is described in one embodiment of the present invention. The method discloses the discovery of an operational range for a hardware device over a plurality of varying operating parameters. The operational range is discovered by testing points, as defined by the plurality of varying operating parameters, to discover an operational boundary of the device. The operational boundary comprises a plurality of boundary points that lie just outside of the operational range of the device. The operational boundary is discovered automatically and without testing all of a plurality of interior operational points within the operational boundary.

BRIEF DESCRIPTION OF THE DRAWINGS

The above and other objects and advantages of the present invention will be more readily appreciated from the following detailed description when read in conjunction with the accompanying drawing, wherein.

PRIOR ART

The drawings referred to in this description should be understood as not being drawn to scale except if specifically noted.

BEST MODES FOR CARRYING OUT THE INVENTION

Reference will now be made in detail to embodiments of the present invention, a method for discovering operational boundaries of an electronic device, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims.

Furthermore, in the following detailed description of the present invention, numerous specific details are set forth in order to provide a thorough understanding of the present invention. However, it will be recognized by one of ordinary skill in the art that the present invention may be practiced without these specific details. In other instances, well known methods, procedures, components, and circuits have not been described in detail as not to unnecessarily obscure aspects of the present invention.

Some portions of the detailed descriptions which follow are presented in terms of procedures, steps, logic blocks, processing, and other symbolic representations of operations on data bits that can be performed on computer memory. These descriptions and representations are the means used by those skilled in the data processing arts to most effectively convey the substance of their work to others skilled in the art. A procedure, computer executed step, logic block, process, etc., is here, and generally, conceived to be a self-consistent sequence of steps or instructions leading to a desired result. The steps are those requiring physical manipulations of physical quantities. Usually, though not necessarily, these quantities take the form of electrical or magnetic signals capable of being stored, transferred, combined, compared, and otherwise manipulated in a computer system. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present invention, discussions utilizing terms such as "testing," or "discovering," or "varying," or "storing," or "inputting," or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Discovering Operational Boundaries in a SHMOO Test

Accordingly, the present invention provides a method and system for discovering operational boundaries that defines an operational range over which an electronic device is functional. The present invention provides for efficient use of resources (e.g., computer, human, etc.) when testing for the operational boundary of an electronic device. In addition, the present invention reduces the amount of testing subjected on an tested electronic device, thereby increasing the reliability of the test by reducing test and device irregularities.

Embodiments of the present invention refer to the testing of an electronic device. Other embodiments are well suited to the testing of any device in order to determine the operational range of the device. For example, in one embodiment, the device is a hardware device, such as, a microprocessor, or a processor embedded on an integrated circuit (IC) chip.

Some embodiments of the present invention are implemented on computer-readable and computer-executable instructions which reside, for example, in computer-readable media of a computer system. The computer system has sufficient hardware (e.g., processor, memory, display, etc.) to run tests on critical electronic components to determine their operational range.

Figure 2:
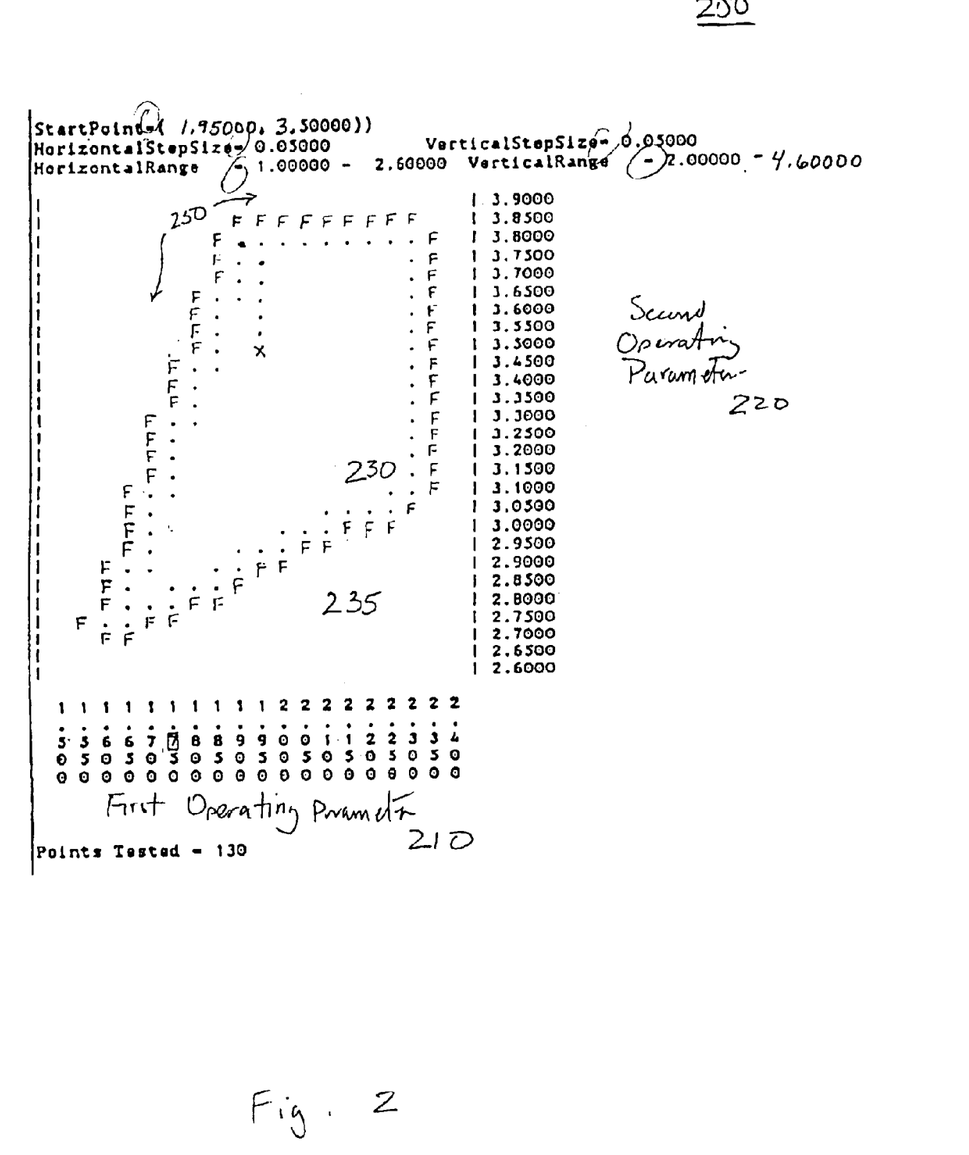
FIG. 2 is a plot diagram showing tested points of failure and operation, in accordance with one embodiment of the present invention.
Figure 3:
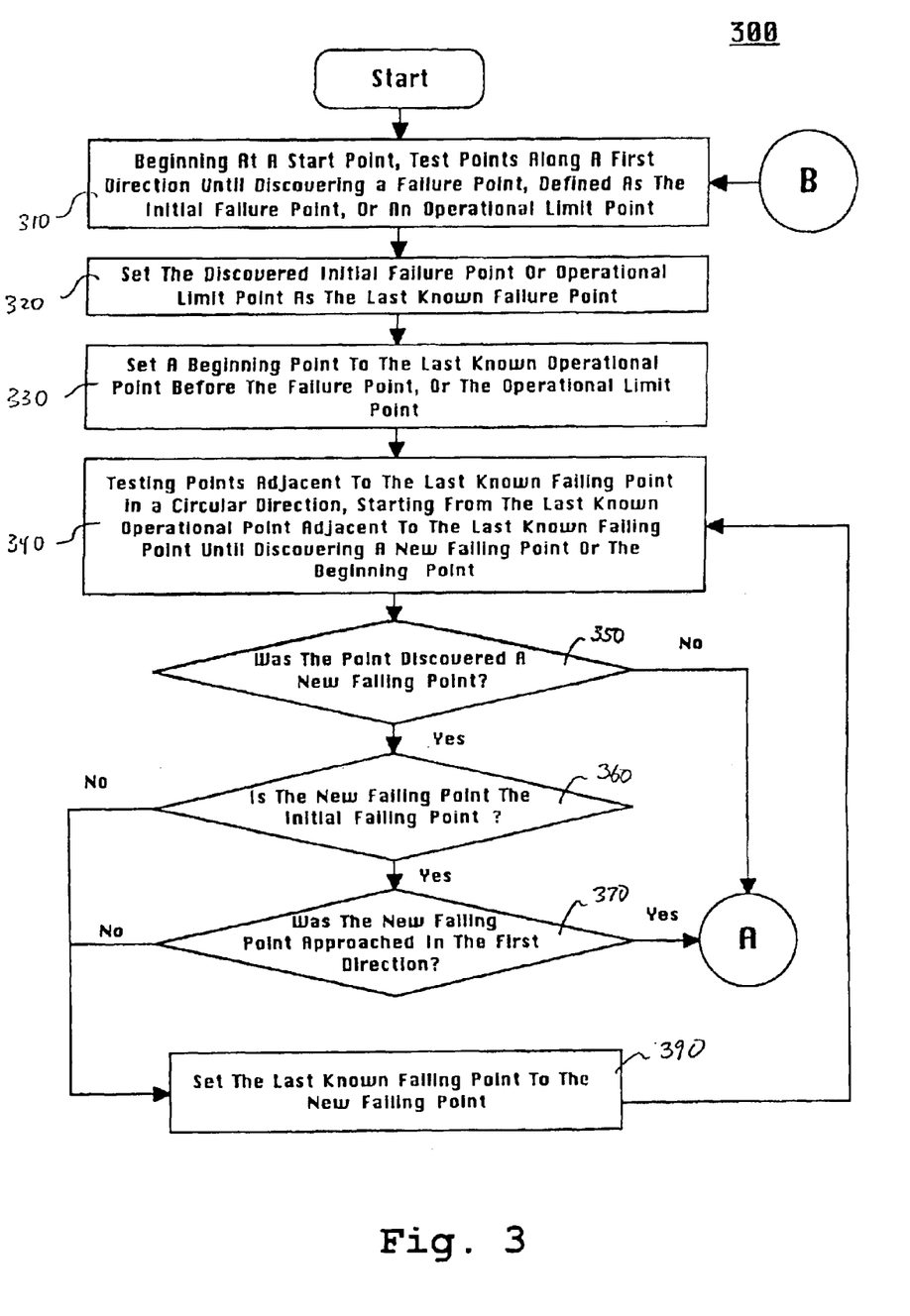
FIG. 3 is a flow diagram illustrating steps in a method for automatically discovering the operational boundary of an electronic device.
Figure 4:
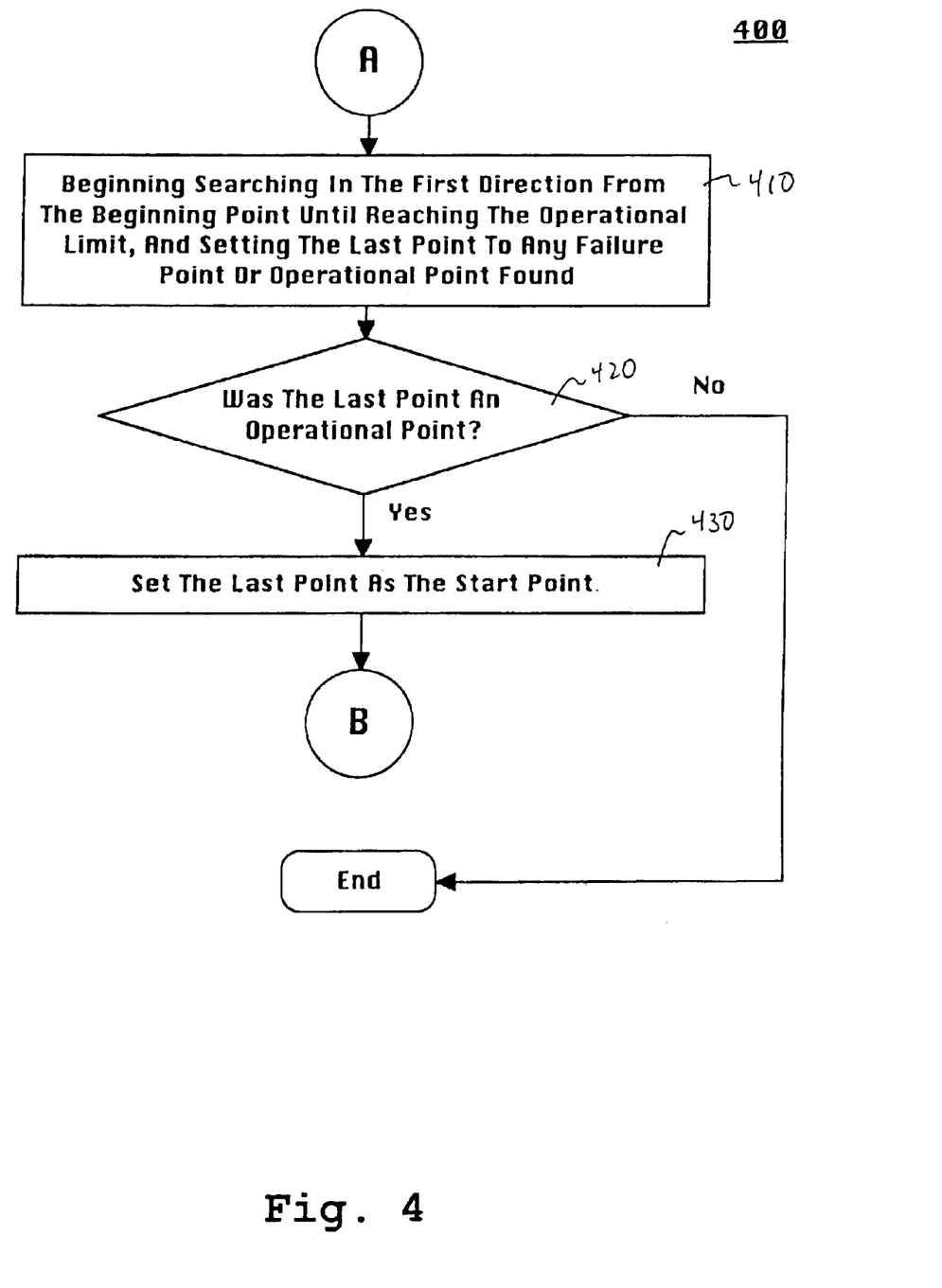
FIG. 4 is a flow diagram illustrating steps in a method for automatically discovering the operational boundary of an electronic device, and for determining whether the discovered operational boundary is part of an inner fault region.

The flow charts in FIGS. 3 and 4 in combination with FIG. 2, disclose a method for automatically discovering the operational boundary that defines the operational range of an electronic device. In one embodiment, the testing for the operational boundary of an electronic device is the automatic implementation of a shmoo test without testing all of a plurality of interior operational points and non-operational points within a pre-defined testing region.

Referring now to FIG. 2, the plot diagram 200 illustrates the discovery of an operational boundary for an electronic device, in accordance with one embodiment of the present invention. In the diagram 200, two operating parameters are varied. Points designated by the letter "F" indicate a failure by the electronic device. Points designated by a dot (".") indicate a successful operation by the electrical device.

Although the electronic device is affected by a plurality of parameters that vary, only two parameters are varied in the present embodiment, while holding all remaining parameters constant. Other embodiments are well suited to varying more than two parameters during a test for the operational boundary.

The diagram 200 is defined by a first operating parameter 210 that varies on the horizontal axis, and a second operating parameter 220 that varies on the vertical axis, in one embodiment. The first operating parameter 210 varies with values ranging from 1.00000 to 2.60000. The second operating parameter 220 varies with values ranging from 2.00000 to 4.6000. The diagram 200 illustrates an operating region for the electronic device, as defined by the first and second operating parameters 210 and 220, respectively. The operating region is a region over which the electronic device may or may not be functional, in other words, the operating region contains further regions of operability and non-operability.

The first and second operating parameters 210 and 220 can include any electrical parameter, such as, input/output voltages, clock frequencies, etc. Furthermore, other embodiments are well suited to testing the electronic device by varying other parameters that have an effect on the operating performance of the electronic device, such as, temperature, etc.

The diagram 200 in FIG. 2 illustrates an operational boundary 250 of the electronic device. The boundary 250 is defined by the continuous and adjacent pattern of plotted "Fs." Table 1 shows the coordinates, as defined by the first and second parameters 210 and 220, for each of the plurality of boundary points of the operational boundary 250.

TABLE 1

Failure Points in the Operational Boundary

| Failure Point | First Parameter | Second Parameter |
| --- | --- | --- |
| Initial Failure Point | 1.95 | 3.85 |
| Failure Point | 1.90 | 3.85 |
| Failure Points | 1.85 | 3.70–3.80 |
| Failure Points | 1.80 | 3.50–3.65 |
| Failure Points | 1.75 | 3.35–3.45 |
| Failure Points | 1.70 | 3.15–3.30 |
| Failure Points | 1.65 | 2.95–3.10 |
| Failure Points | 1.60 | 2.80–2.90 |

TABLE 1-continued

Failure Points in the Operational Boundary

| Failure Point | First Parameter | Second Parameter |
|---|---|---|
| Failure Point | 1.55 | 2.75 |
| Failure Points | 1.60–1.65 | 2.70 |
| Failure Points | 1.70–1.75 | 2.75 |
| Failure Points | 1.80–1.85 | 2.80 |
| Failure Point | 1.90 | 2.85 |
| Failure Points | 1.95–2.00 | 2.90 |
| Failure Points | 2.05–2.10 | 2.95 |
| Failure Points | 2.15–2.25 | 3.00 |
| Failure Point | 2.30 | 3.05 |
| Failure Points | 2.35 | 3.10–3.80 |
| Failure Points | 2.30–2.00 | 3.85 |
| Back to Initial Failure Point | | |

The operational boundary 250 defines an interior region 230. The interior region 230 is the operational range of the electronic device and defines points, as defined by the first and second parameters 210 and 220, where the electronic device is functional. In the test for discovering the operational boundary 250, as disclosed in flow charts 300 and 400, operational points that are tested indicate that the device successfully boots up and runs test applications at the point tested.

The operational boundary 250 also defines an exterior region 235. The exterior region 235 is outside of the operational range of the electronic device, and defines points, as defined by the first and second parameters 210 and 220, where the electronic device is non-functional. In the test for discovering the operational boundary 250, as disclosed in flow charts 300 and 400, non-functional points that are tested indicate that the device does not successfully boot up and run test applications at the point tested. In another embodiment, the process as disclosed in flow charts 300 and 400 is able to determine the type of fault at a non-functional or non-operational point. In another embodiment, the type of fault is indicated on a plot of tested points, such as, the plot diagram of FIG. 2.

FIGS. 3 and 4 are flow charts 300 and 400 illustrating steps in a method for discovering an operational boundary that defines an operational range of an electronic device, in accordance with one embodiment of the present invention. The operational range is defined over a plurality of varying operating parameters. By testing points, as defined by the plurality of varying operating parameters, an operational boundary of said device is discovered, such as, the operational boundary 250 of FIG. 2. The operational boundary is comprised of a plurality of boundary points just outside of the operational range. The plurality of boundary points is a plurality of failure points. Furthermore, the operational boundary is discovered without testing all of a plurality of interior operational points within the operational boundary. In another embodiment, the method disclosed in flow charts 300 and 400 is performed automatically.

Referring now to FIG. 3, to discover the operational boundary of an electronic device, the present embodiment begins at a known operational point, a starting point, in step 310. The known operational point is predefined by a user, and is known to be within the operational boundary of the electronic device. For example, referring to FIG. 2, a known operational point is the point ("x") at coordinates (1.95, 3.50).

Continuing with step 310, the present embodiment tests adjacently coupled points in a first direction. In one embodiment, the direction is defined by varying one parameter in an increasing manner from the starting point. All the other parameters in the plurality of parameters that could affect the electronic device are held constant. Referring now to FIG. 2, beginning from the starting point "x", the direction proceeds upwards in diagram 200 by varying the second operating parameter 220 in an increasing manner. All the other plurality of parameters, including the first parameter 210, are held constant. Other embodiments are well suited to any number of directions, e.g., varying the one parameter in decreasing fashion, or varying one or more parameters in linear and non-linear manners, etc.

Also, the present embodiment tests adjacently coupled points in the aforementioned first direction until a failure point, an initial failure point, is discovered or detected, in step 310. Referring now to FIG. 2, the first failure point detected is the initial failure point at the coordinates (1.95, 3.85). The initial failure point is assumed to be one of the plurality of boundary points that comprise the operational boundary 250 of the electronic device.

In another embodiment, the present embodiment tests adjacently coupled points in the aforementioned direction until reaching an operational limit point that resides outside the operational limit of the component being tested. The operational limits of the component are predefined by a user. For each parameter in the plurality of parameters that affects the electrical properties of the electrical device, an upper and lower limit is set. The upper and lower limit defines the upper and lower boundaries of an operating limit for the electrical device for that parameter. By combining the upper and lower limits for each of the parameters, an operational limit for the device can be determined. Points outside the operational limit are determined to be non-operational, such that, these points are defined as failure points. Points within the operation limit can be operational or non-operational (e.g., failure point).

Before reaching the initial failure point or the operational limit, the present embodiment tests points that are operational and are within the operational boundary of the device. The present embodiment then sets the initial failure point, or the operational limit point, as the last known failure point, in step 320. Further, the present embodiment sets a beginning point as the last known operational point before reaching the last known operational point, in step 330.

From the initial failure point, or the operational limit point, the present embodiment tests for and discovers each of the plurality of boundary points that are adjacently coupled in succession until returning to the initial failure point. More specifically, the present embodiment tests points adjacent to the last known failing point in a circular direction, in step 340. The present embodiment starts from the last known operational point that is adjacent to the last known failing point until discovering a new failing point, or alternatively, the beginning point.

In one embodiment, each of the plurality of boundary points that comprise the operational boundary are adjacently coupled to another boundary point and to an interior operational point. A point in the plot diagram 200 potentially can have eight adjacent points. For example from the initial failure point (1.95, 3.85), adjacent points are as follows: 2.00, 3.90; 1.95, 3.90; 1.90, 3.90; 1.90, 3.85; 1.90, 3.80; 1.95, 3.80; 2.00, 3.80; and 2.00, 3.85.

Each of the plurality of boundary points are discovered in succession. The present embodiment tests points adjacent to the last known failing point, a boundary point, in a circular direction, in step 340. In one embodiment, the circular direction is in a clockwise direction. In another embodiment, the circular direction is in a counter-clockwise direction.

Continuing with step 340, the adjacent points that are tested are selected by moving in a clockwise direction from a known operational point that has been tested, and that is adjacent to the last known failing point, in one embodiment of the present invention. The adjacent points are tested until another failing point, a new failing point, or the beginning point is discovered or detected. This new failing point is also one of the plurality of boundary points that comprise the operational boundary of the electronic device.

For example, from the initial failing point (1.95, 3.85), the known operational point (1.95, 3.80) is also adjacent to the initial failing point, and has been previously tested. Moving in a clockwise direction from that known operational point, the first adjacent point that is tested is at the coordinates (1.90, 3.80). This point is an operational point. The next point selected for testing is at the coordinates (1.90, 3.85) and is the new failing point.

In another embodiment, if a point to be tested has been previously tested in the present test cycle, then the results from the previous test are used to determine if that point is operational or non-operational.

The process is repeated for every new failing point that is discovered. In condition step 350, the present embodiment determines if the point discovered is a new failing point. If the discovered failing point is a new failing point, then the flow chart 300 proceeds to condition step 360. If the discovered failing point is not a new failing point, it is necessarily the beginning point, and the flow chart 300 proceeds to "A," as disclosed in FIG. 4, to determine if the operational boundary is part of an interior fault region.

Returning to step 360, the flow chart 300 determines if the new failing point is the initial failing point, in one embodiment of the present invention. If the new failing point is the initial failing point, then the process in flow chart 300 proceeds to step 370. If the new failing point is not the initial failing point, then the process in flow chart 300 proceeds to step 390.

If the new failing point is the initial failing point, then flow chart 300 determines if the new failing point was approached following in the first direction, in condition step 370. This is accomplished to test for an anomalous operational boundary having boundary points possibly separated from other points in the plurality of boundary points by a single operational point. This embodiment ensures proper discovery of the entire boundary region that defines the operational range of the tested electronic device. As such, if the new failing point was approached in the first direction, then flow chart 300 proceeds to "A," as disclosed in FIG. 4. On the other hand, if the new failing point is the initial failing point, but was not approached in the first direction, then the flow chart 300 proceeds to step 390.

Returning to step 390, the present embodiment sets the last known failing point to the new failing point. Thereafter, flow chart 300 proceeds back to step 340 to discover another new failing point. This process is recursively applied, new failure point after new failure point, until discovery of each of the plurality of boundary points that defines the operational boundary of the tested electronic device.

FIG. 4 is a flow chart 400 illustrating steps in a method for determining whether a plurality of boundary points is part of an interior fault region, in accordance with one embodiment of the present invention. The flow charts in FIGS. 3 and 4 combine to form a method for determining an operational boundary of an electronic device. The flow chart 400 is implemented to determine if an operational boundary discovered in flow chart 300 fully defines the operating region of the electronic device and is not part of an interior fault region within the operating region.

In step 410, the present embodiment returns to the beginning point, as defined in step 330. From the beginning point, the present embodiment searches points along the first direction for test results until reaching an operational limit point. Points within the operational limit lie within a region predefined by a user to protect the tested electronic device from damage. The present embodiment does not test the points between the beginning point and the operational limit. Instead, the present embodiment examines test results for those points between the beginning point and the operational limit. If any of those points have not been tested, then there are no test results for that point.

For example, looking at the plot diagram 200 of FIG. 2, the beginning point has coordinates (1.95, 3.80). Continuing in the same direction as predefined in flow chart 300, adjacently coupled points are examined for test results in a first direction until reaching the operational limit. For example, in FIG. 3, the direction of examination would be along the y-axis (the second parameter) in an increasing manner.

Continuing with step 410, the present embodiment sets the last point as a last failure point or operational point found in a first direction moving from the beginning point to the operational limit. Points with no test results have no bearing on the outcome of step 410.

In condition step 420, the present embodiment determines if the last point was an operational point. If the last point is not an operational point, then the plurality of boundary points is not part of an interior fault region. As such, the operational boundary defines the operational range of the electrical device and the process illustrated in flow chart 400 ends.

On the other hand, if the last point was an operational point, then the present embodiment proceeds to step 430. In this case, the process outlined in flow chart 400 has determined that the plurality of boundary points lies within an interior fault region. As such, the present embodiment sets the last point as the start point in step 430 and begins the process in flow chart 300 again. Specifically, from step 430, the present embodiment proceeds to "B," which leads back to step 310 in flow chart 300.

In this manner, by recursively applying the steps in the processes outlined in flow charts 300 and 400, a plurality of boundary points that define an operating region are discovered, and tested to determine if they define an interior fault region. This process is repeated, and may move back and forth between flow charts 300 and 400 repeatedly, until the plurality of boundary points are found not to be part of an interior fault region, and fully define the operating region of a tested electronic device.

While the methods of embodiments illustrated in flow charts 300 and 400 show specific sequences and quantity of steps, the present invention is suitable to alternative embodiments. For example, not all the steps provided for in the method are required for the present invention. Furthermore, additional steps can be added to the steps presented in the present embodiment. Likewise, the sequences of steps can be modified depending upon the application.

A method and apparatus for discovering an operational boundary and an operational range of an electrical device, is thus described. While the present invention has been described in particular embodiments, it should be appreciated that the present invention should not be construed as limited by such embodiments, but rather construed according to the below claims.

While the invention has been illustrated and described by means of specific embodiments, it is to be understood that numerous changes and modifications may be made therein without departing from the spirit and scope of the invention as defined in the appended claims and equivalents thereof.

What is claimed is:

1. A method of testing operational boundaries comprising:
   discovering an operational range over a plurality of varying operating parameters for a device by testing points, as defined by said plurality of varying operating parameters, beginning from a known interior operational point as a single starting point when fully testing said device, to discover adjacently coupled boundary points that define an operational boundary of said device that comprises a plurality of boundary points just outside of said operational range, without testing all of a plurality of interior operational points within said operational boundary.

2. The method of testing operational boundaries as described in claim 1, further comprising:
   automatically discovering said operational range by automatically testing for said operational boundary.

3. The method of testing operational boundaries as described in claim 1, further comprising:
   varying a first and second parameter in said plurality of varying parameters; and
   holding constant all remaining parameters in said plurality of varying parameters.

4. The method of testing operational boundaries as described in claim 1, further comprising:
   i) beginning from said known interior operational point, testing adjacently coupled points in a first direction until an initial failure point is discovered, said initial failure point being one of said plurality of boundary points; and
   ii) from said initial failure point, testing for and discovering each of said plurality of boundary points that are adjacently coupled until returning to said initial failure point.

5. The method of testing operational boundaries as described in claim 4, wherein said first direction varies in only one of said plurality of varying parameters in an increasing manner, holding all remaining parameters in said plurality of varying parameters constant.

6. The method of testing operational boundaries as described in claim 4, wherein ii) comprises:
   beginning from a last known boundary point, testing adjacent points in a circular direction starting from known and adjacent interior operational points until a new failure point is discovered, said new failure point being one of said plurality of boundary points; and
   recursively testing adjacent points in said circular direction with each newly discovered new failure point until again reaching said initial failure point.

7. The method of testing operational boundaries as described in claim 6, wherein said circular direction is a clockwise direction.

8. The method of testing operational boundaries as described in claim 1, further comprising:
   setting an upper and lower limit for each of said varying parameters that define operational limits of said operational boundary, wherein points lying outside of said operational limits are points of operational failure.

9. The method of testing operational boundaries as described in claim 1, wherein each of said plurality of boundary points and operational points of failure indicate said device does not successfully boot up and run test applications, and each of said plurality of interior operational points that have been tested indicate said device does successfully boot up and run test applications.

10. The method of testing operational boundaries as described in claim 1, further comprising:
    determining whether said plurality of boundary points is part of an interior fault region within said operational boundary; and
    discovering a second operational boundary of said device that comprises a second plurality of boundary points just outside of said operational range if said plurality of boundary points is part of said interior fault region.

11. A method of testing operational boundaries, comprising:
    a) varying a first and second operating parameter in a plurality of operating parameters, said plurality of operating parameters defining points in an operating region for a device;
    b) beginning from a known operational point of said device as a starting point when fully testing said device, testing adjacently coupled points in a direction until an initial failure point is discovered; and
    c) from said initial failure point, testing for and discovering each of a plurality of failure points that are adjacently coupled until returning to said initial failure point, said plurality of failure points defining an operational boundary for said device that bounds an operational range comprising a plurality of interior operational points within said operating region for said device.

12. The method of testing operational boundaries as described in claim 11, wherein a), b), and c) are performed automatically.

13. The method of testing operational boundaries as described in claim 11, wherein said direction varies in said first parameter in an increasing manner, holding all remaining parameters in said plurality of varying parameters constant.

14. The method of testing operational boundaries as described in claim 11, wherein c) comprises:
    beginning from a last known boundary point, testing adjacent points in a circular direction starting from known and adjacent interior operational points until a new failure point is discovered, said new failure point being one of said plurality of boundary points; and
    recursively testing adjacent points in said circular direction with each newly discovered new failure point until again reaching said initial failure point.

15. The method of testing operational boundaries as described in claim 11, further comprising:
    d) discovering if said plurality of failure points bound an interior fault region within said operational range; and
    e) testing for a second plurality of failure points if all of known said plurality of interior operational points do not lie within said plurality of failure points.

16. The method of testing operational boundaries as described in claim 15, wherein d) comprises:
    discovering said interior fault region, if a last point that has been tested in a set of adjacent points that are examined from said beginning point to an operational limit in said direction is an operational point.

17. The method of testing operational boundaries as described in claim 16, wherein e) comprises:

beginning from said last point, testing for and discovering each of a second plurality of failure points that are adjacently coupled until returning to said last point, said second plurality of failure points defining a second operational boundary that bounds said operational range within said operating region for said device.

18. The method of testing operational boundaries as described in claim 11, wherein said device is a chip forming an integrated circuit.

19. The method of testing operational boundaries as described in claim 11, further comprising:

discovering the type of fault at each of said plurality of failure points.

20. The method of testing operational boundaries as described in claim 11, wherein said plurality of operating parameters is taken from a group consisting of:

frequency;

voltage;

current; and temperature.

21. A computer system comprising:

a processor; and a computer readable memory coupled to said processor and containing program instructions that, when executed, implement a method of testing operational boundaries comprising:

discovering an operational range over a plurality of varying operating parameters for a device by testing points, as defined by said plurality of varying operating parameters, beginning from a known interior operational point as a single starting point when fully testing said device, to discover adjacently coupled boundary points that define an operational boundary of said device that comprises a plurality of boundary points just outside of said operational range, without testing all of a plurality of interior operational points within said operational boundary.

22. The computer system as described in claim 21, wherein said method further comprises:

automatically discovering said operational range by automatically testing for said operational boundary.

23. The computer system as described in claim 21, wherein said method further comprises:

varying a first and second parameter in said plurality of varying parameters; and holding constant all remaining parameters in said plurality of varying parameters.

24. The computer system as described in claim 21, wherein said method further comprises:

i) beginning from said known interior operational point, testing adjacently coupled points in a first direction until an initial failure point is discovered, said initial failure point being one of said plurality of boundary points; and ii) from said initial failure point, testing for and discovering each of said plurality of boundary points that are adjacently coupled until returning to said initial failure point.

25. The computer system as described in claim 24, wherein said first direction varies in only one of said plurality of varying parameters in an increasing manner, holding all remaining parameters in said plurality of varying parameters constant.

26. The computer system as described in claim 24, wherein ii) in said method comprises:

beginning from a last known boundary point, testing adjacent points in a circular direction starting from known and adjacent interior operational points until a new failure point is discovered, said new failure point being one of said plurality of boundary points; and recursively testing adjacent points in said circular direction with each newly discovered new failure point until again reaching said initial failure point.

27. The computer system as described in claim 26, wherein said circular direction is a clockwise direction.

28. The computer system as described in claim 21, wherein said method further comprises:

setting an upper and lower limit for each of said varying parameters that define operational limits of said operational boundary, wherein points lying outside of said operational limits are points of operational failure.

29. The computer system as described in claim 21, wherein each of said plurality of boundary points and operational points of failure indicate said device does not successfully boot up and run test applications, and each of said plurality of interior operational points that have been tested indicate said device does successfully boot up and run test applications.

30. The computer system as described in claim 21, wherein said method further comprises:

determining whether said plurality of boundary points is part of an interior fault region within said operational boundary; and discovering a second operational boundary of said device that comprises a second plurality of boundary points just outside of said operational range if said plurality of boundary points is part of said interior fault region.

* * * * *